(12) United States Patent
Muka et al.

(10) Patent No.: US 7,595,972 B2
(45) Date of Patent: Sep. 29, 2009

(54) CLAMP FOR USE IN PROCESSING SEMICONDUCTOR WORKPIECES

(75) Inventors: Richard Muka, Topsfield, MA (US); Paul Murphy, Reading, MA (US); David E. Suuronen, Newburyport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 362 days.

(21) Appl. No.: 11/263,113

(22) Filed: Oct. 31, 2005

(65) Prior Publication Data

US 2006/0171094 A1    Aug. 3, 2006

Related U.S. Application Data

(63) Continuation-in-part of application No. 11/101,832, filed on Apr. 8, 2005, now abandoned.

(60) Provisional application No. 60/560,912, filed on Apr. 9, 2004.

(51) Int. Cl.
*H01T 23/00* (2006.01)
(52) U.S. Cl. ........................ 361/234; 361/230
(58) Field of Classification Search .......... 361/230–234
See application file for complete search history.

(56) References Cited

U.S. PATENT DOCUMENTS

| 5,315,473 | A | * | 5/1994 | Collins et al. | 361/234 |
| 5,539,179 | A | * | 7/1996 | Nozawa et al. | 219/121.43 |
| 5,636,098 | A | | 6/1997 | Salfelder et al. | |
| 5,986,875 | A | | 11/1999 | Donde et al. | |
| 6,048,434 | A | * | 4/2000 | Tamura et al. | 156/345.52 |
| 6,228,278 | B1 | * | 5/2001 | Winniczek et al. | 216/61 |
| 6,259,592 | B1 | * | 7/2001 | Ono | 361/234 |
| 6,278,600 | B1 | | 8/2001 | Shamouilian et al. | |
| 6,583,979 | B1 | * | 6/2003 | Takahasi et al. | 361/234 |
| 6,693,790 | B2 | * | 2/2004 | Matsuki et al. | 361/234 |
| 6,768,627 | B1 | * | 7/2004 | Kitabayashi et al. | 361/234 |
| 7,221,553 | B2 | * | 5/2007 | Nguyen et al. | 361/234 |
| 2004/0173469 | A1 | * | 9/2004 | Udo et al. | 205/324 |

FOREIGN PATENT DOCUMENTS

WO    WO 79/00510    8/1979

* cited by examiner

*Primary Examiner*—Danny Nguyen

(57) ABSTRACT

An apparatus is provided to improve clamping of a work piece to a support surface. The apparatus includes a support base, an insulator layer disposed on the support base, an electrode layer disposed on the insulator layer, and a clamping layer comprising aluminum oxynitride disposed on the electrode layer wherein the workpiece is clamped to the surface of the clamping layer. The apparatus provides a higher clamping force for the workpiece while reducing gas leakage and particle levels in addition to maintaining a declamping time suitable for high throughput processing. The apparatus may further provide a raised surface geometry or embossments on the dielectric or a dielectric comprising an outer ring a center cavity for reducing particle contamination to the backside of the workpiece. Also, a thin wall sleeve may be provided between the base and the insulator and alternating current may be applied to opposite ones of interdigitated electrode pairs to reduce particle contamination and improve the implantation uniformity.

17 Claims, 12 Drawing Sheets

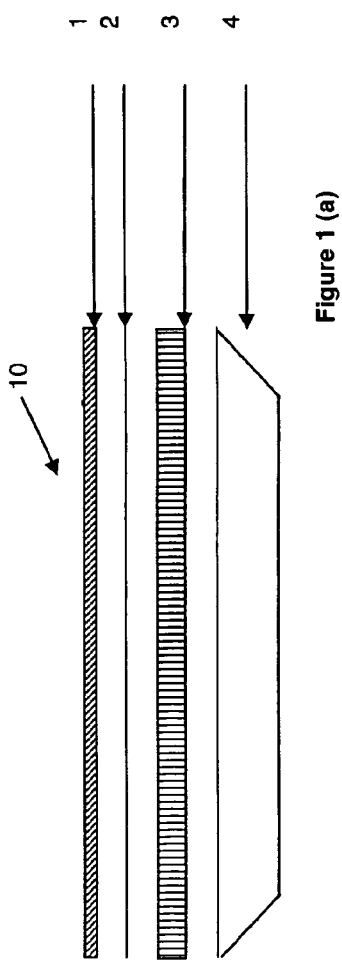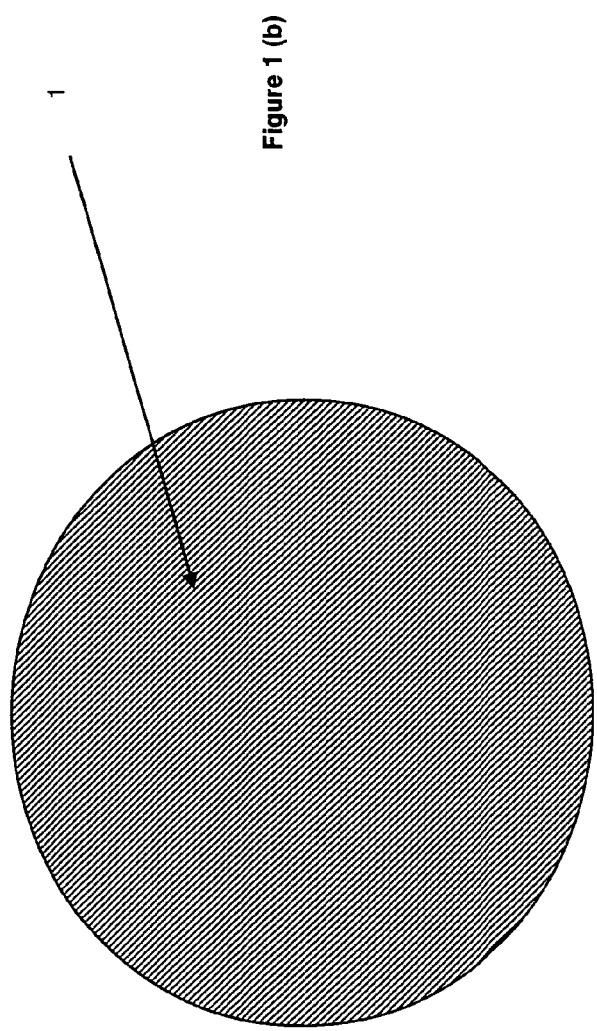

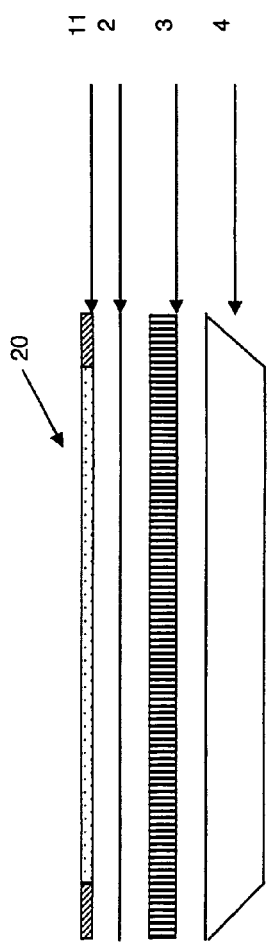
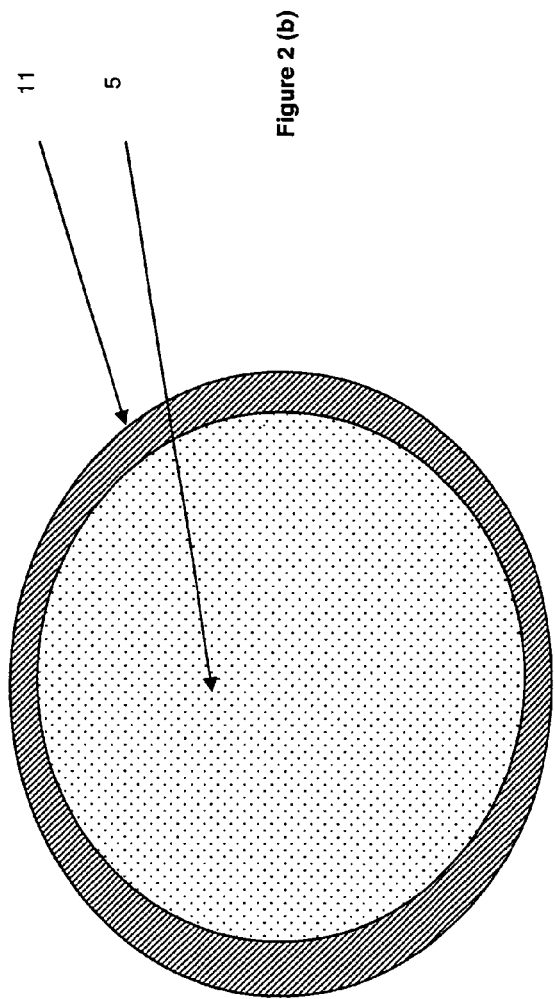

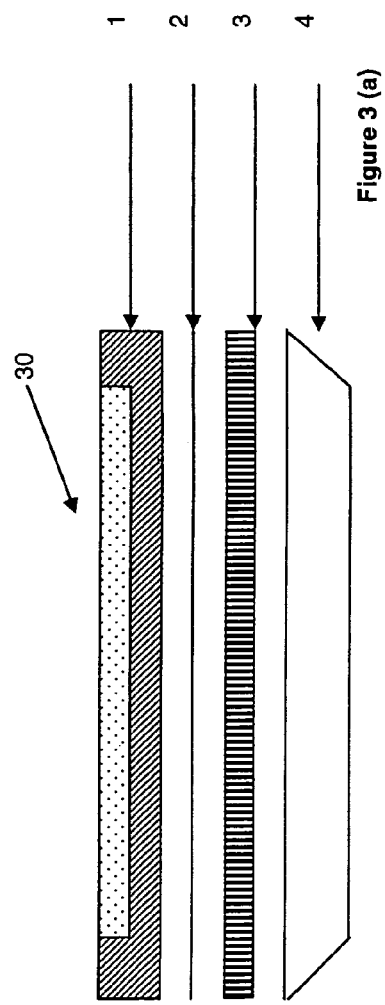
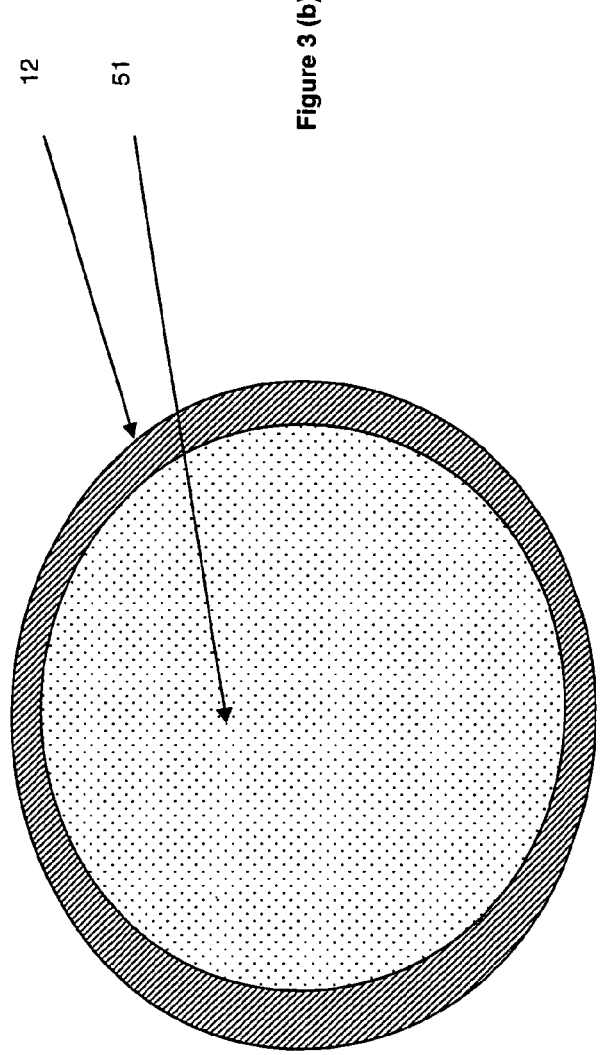

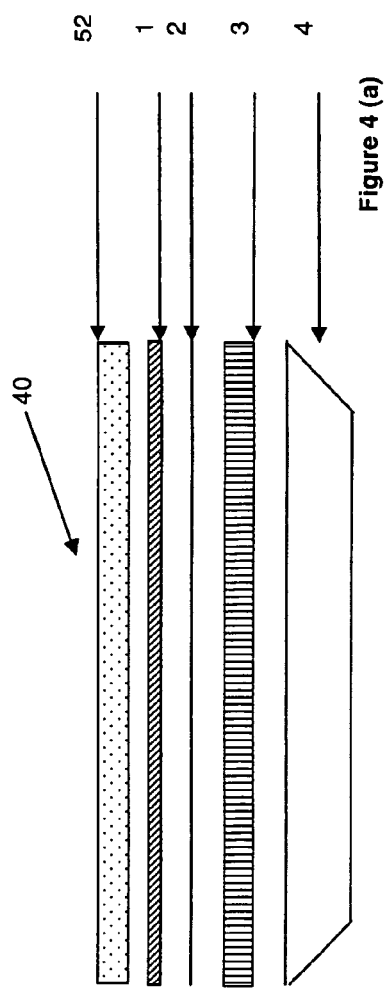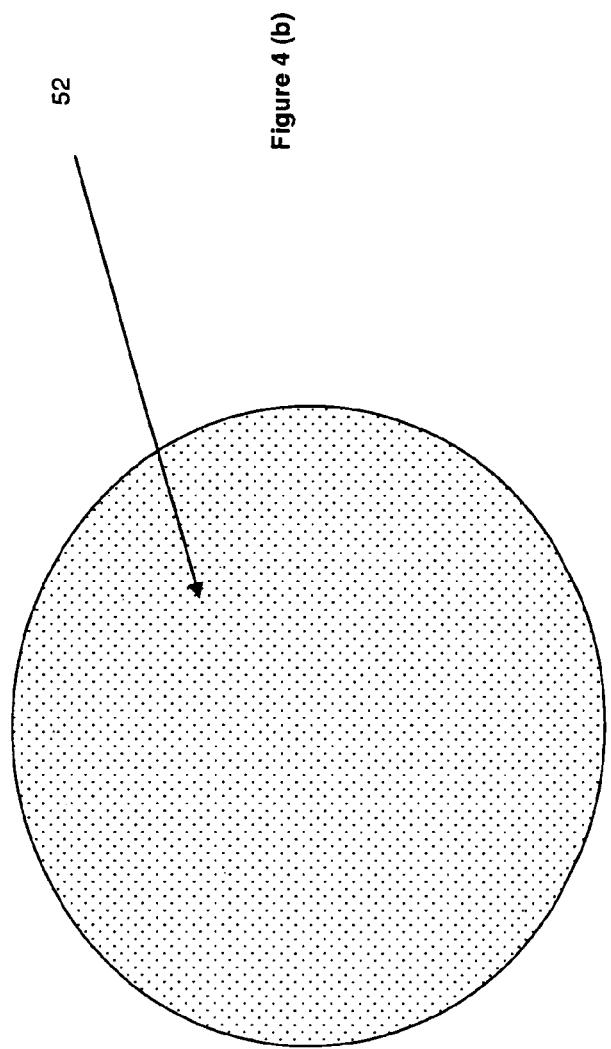

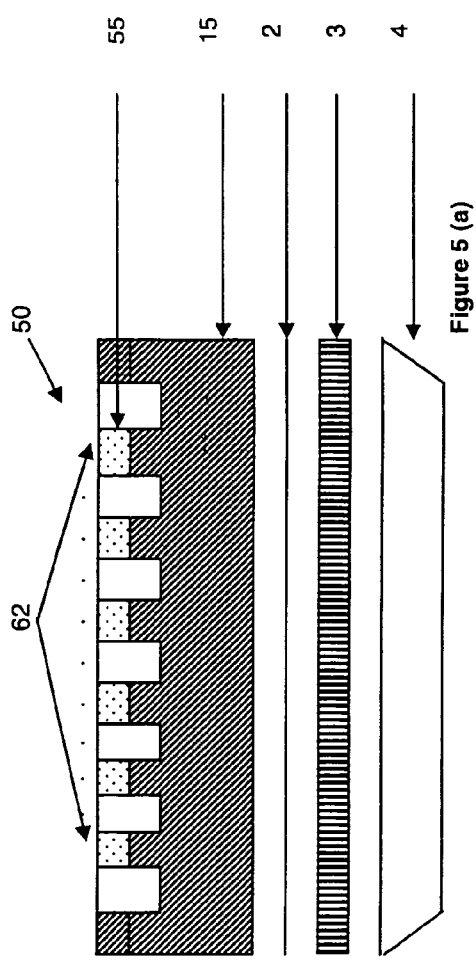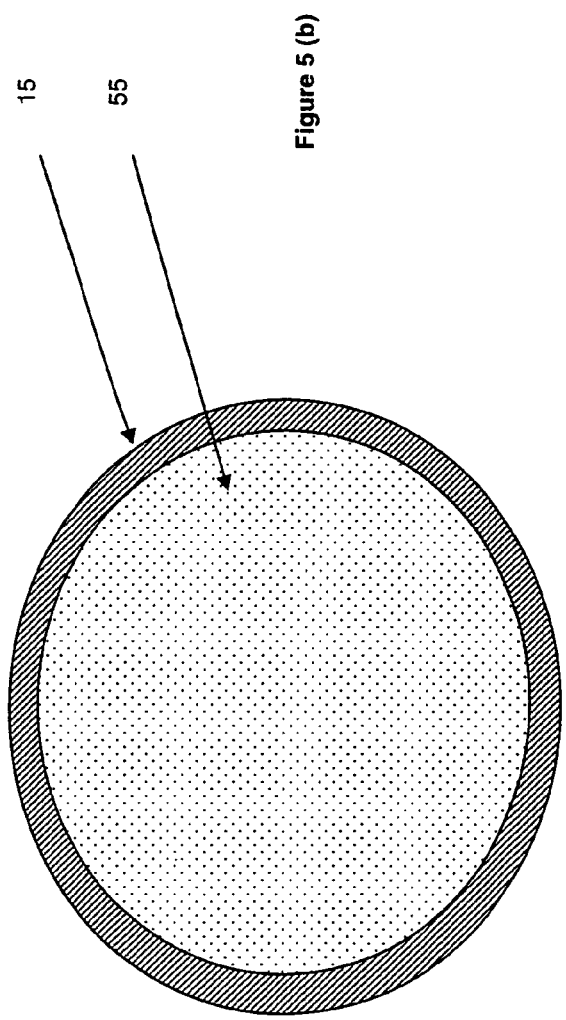

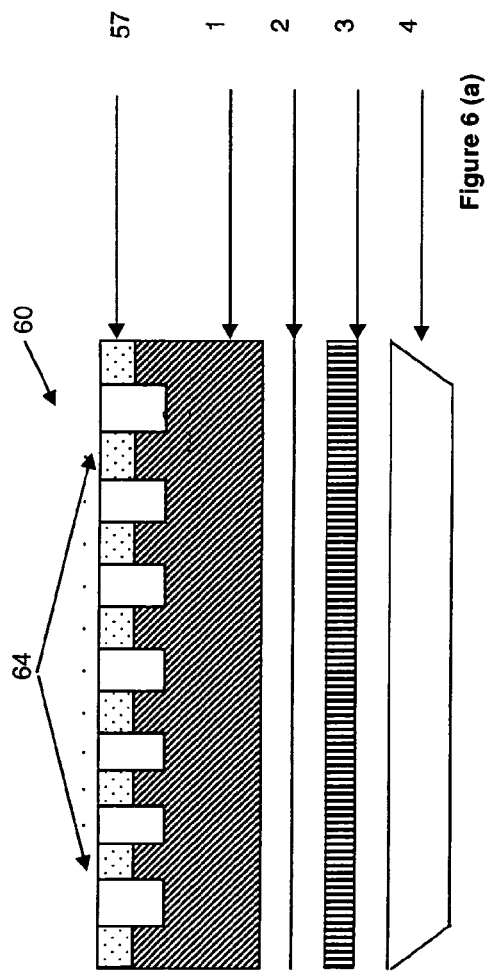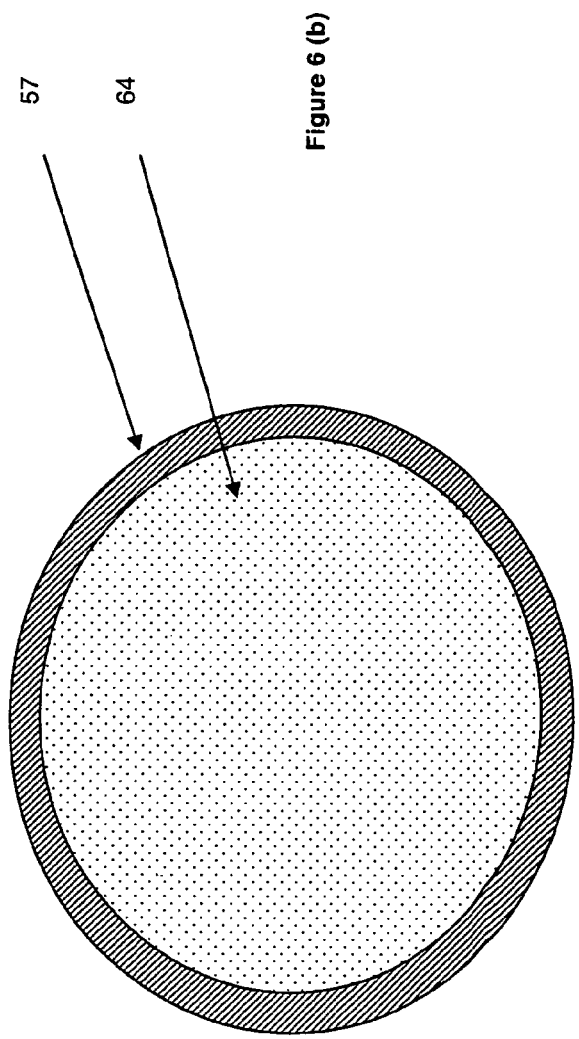

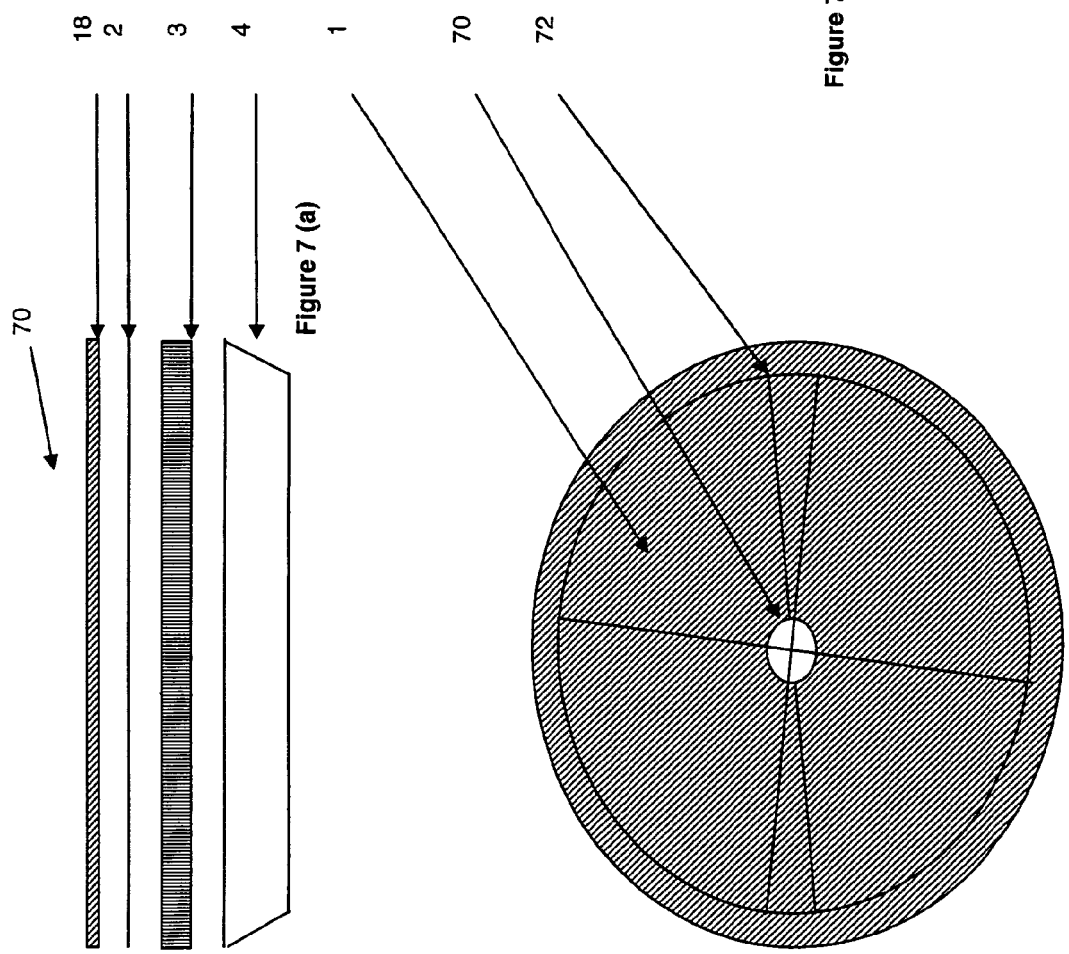

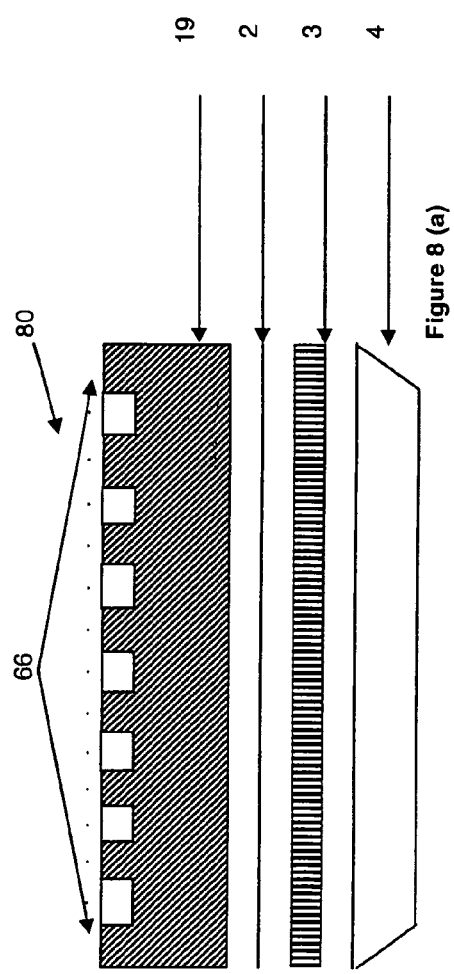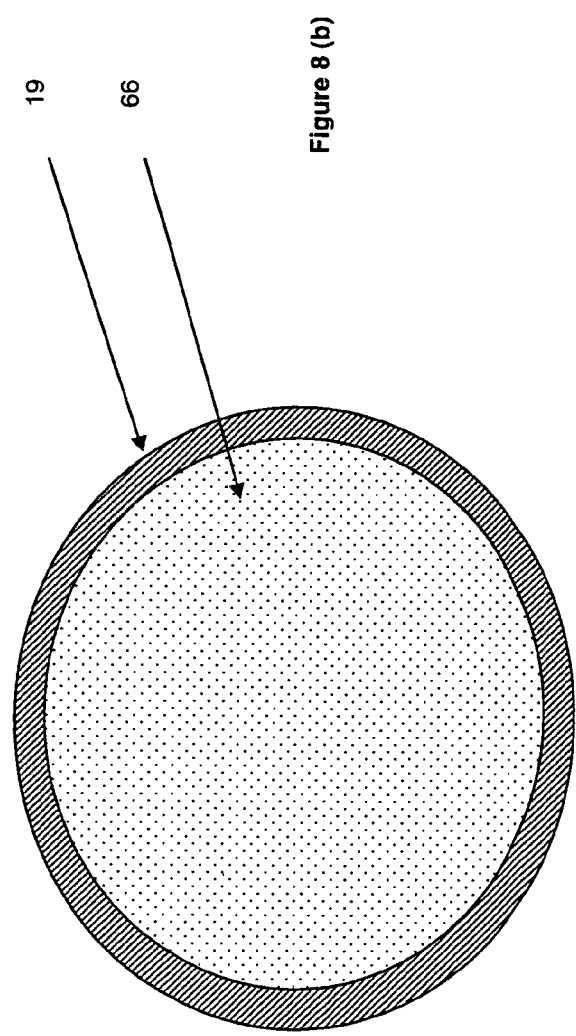

CLAMP FOR USE IN PROCESSING SEMICONDUCTOR WORKPIECES

RELATED APPLICATIONS

This application is a continuation-in-part of U.S. Ser. No. 11/101,832 filed Apr. 8, 2005, now abandoned entitled "Clamp For Use In Processing Semiconductor Workpieces," the disclosure of which is hereby incorporated by reference.

This application claims priority under 35 U.S.C. § 119(e) to U.S. Provisional Patent Application Ser. No. 60/560,912, filed Apr. 9, 2004, entitled "Electrostatic Clamp For Use In Processing Semiconductor Workpieces," the disclosure of which is hereby incorporated by reference.

BACKGROUND

In the fabrication of integrated circuits, a number of well-established processes involve the application of ion beams to semiconductor wafers in vacuum. These processes include, for example, ion implantation, ion beam milling, and reactive ion etching. In each instance, an ion beam is generated in a source and is directed with varying degrees of acceleration toward a target wafer. Ion implantation has become a standard technique for introducing conductivity altering impurities into semiconductor wafers. A desired impurity material is ionized in an ion source, the ions are accelerated to form an ion beam of determined energy and is directed at the surface of a wafer. Energetic ions penetrate into the bulk of the semiconductor material becoming embedded in the crystalline lattice of the semiconductor material to form a region of desired conductivity.

The semiconductor wafer must be firmly clamped in a position for ion implantation. A number of methods are known in the art to clamp a wafer. One such technique involves the application of electrostatic forces to firmly position the wafer. A dielectric layer is positioned between the semiconductor wafer and electrodes, and insulated from a support plate. Voltages of opposite polarities applied to pairs of electrodes generate electrostatic forces firmly holding a semiconductor wafer against the dielectric layer.

It has been previously known that materials, such as alumina, sapphire, silicon carbide, aluminum nitride, and diamond have been used as material for the dielectric layer. Alumina is widely used material for the dielectric layer for its cost and ready availability.

A transparent ceramic material has been disclosed in U.S. Pat. Nos. 4,481,300; 4,520,116; 4,720,362; and 5,135,814. Its optical transparency, as well as its transmissibility characteristics in the ultraviolet, visible and infrared spectrums characterizes this transparent ceramic material known as aluminum oxynitride. However, this material is used primarily for military applications for windows, radar and infrared domes to protect sensor packages on missiles and aircraft. Aluminum oxynitride was not believed to be applicable for electrostatic clamps due the difficulty in processing aluminum oxynitride powders and manufacturability of the very thin dielectric layer, in addition to unknown technical performance characteristics.

Problems associated with electrostatic clamps disclosed in U.S. Pat. No. 6,388,861 include insufficient wafer clamping force, charging current damage to devices on the wafer, difficulty in making electrical contact to the semiconductor wafer, wafer declamp time, and inadequate transfer of heat from a semiconductor wafer work piece. Furthermore, customer applications have identified leakage of cooling gas into the process chamber, particles, dielectric withstand voltage, and platen lifetime as being additional performance requirements.

SUMMARY OF THE INVENTION

It is the general object of this present invention to provide improved methods and apparatus for clamping of a workpiece to a support surface.

According to a first aspect of the invention, an apparatus comprises a support base, an insulator layer disposed on the support base, an electrode layer disposed on the insulator layer, and a clamping layer comprising aluminum oxynitride disposed on the electrode layer wherein the workpiece is clamped to the surface of the clamping layer. The apparatus provides a higher clamping force for the workpiece while reducing gas leakage and particle levels in addition to maintaining a declamping time suitable for high throughput processing.

According to another aspect of the invention, an apparatus comprises a support base, an insulator layer disposed on the support base, an electrode layer disposed on the insulator layer, and a clamping layer comprising a dielectric layer and a resilient material layer disposed on the electrode layer wherein the workpiece is clamped to the surface of the clamping layer. The apparatus and configurations of the dielectric and resilient layers further reduce backside particle generation while providing a high clamping force for the workpiece.

Another aspect of the present invention is directed to providing a raised surface geometry or embossments on the dielectric layer of a clamp for lowering the gas leakage and particle generation so that heat transfer from the workpiece is improved.

Another aspect of the present invention provides a dielectric comprised of an outer ring and a center cavity such that a workpiece is only disposed on the outer ring. By reducing the contact between the dielectric and the workpiece, particle contamination is reduced on the backside of the workpiece.

In yet another aspect of the present invention, a thin wall sleeve is provided between the insulator and the base so that bowing of the dielectric is minimized and a more uniform implantation is realized.

In a further aspect of the present invention, alternating current is applied to opposite ones of interdigitated electrodes so that relative motion between the workpiece and the dielectric is limited and particle contamination is minimized.

It is another object of this present invention to provide improved methods and apparatus for electrostatic or mechanical semiconductor wafer clamping.

A further object of this present invention is to provide an electrostatic clamping apparatus with a high withstand voltage for the use with semiconductor wafers.

An additional object of this invention is to provide an electrostatic clamping apparatus with low particle generation.

Another object of this invention is to provide an electrostatic clamping apparatus with a flat surface for zero degree implants.

It is another object of this invention is to provide an electrostatic clamping apparatus which controls the leakage of cooling gas into the ion implanter process chamber.

Yet another object of this present invention is to provide an electrostatic clamping apparatus with longer lifetime.

BRIEF DESCRIPTION OF THE DRAWINGS

For a better understanding of the present invention together with other and further objects, advantages and capabilities thereof, reference is made to the accompanying drawings which are incorporated herein by reference:

FIGS. 1(a) and 1(b) illustrate cross sectional and top views respectively of an aluminum oxynitride clamp according to an embodiment of the present invention;

FIGS. 2(a) and 2(b) illustrate cross sectional and top views respectively of a clamp having a dielectric ring with a resilient center according to another embodiment of the present invention;

FIGS. 3(a) and 3(b) illustrate cross sectional and top views respectively of a clamp having a dielectric ring with a resilient center according to a further embodiment of the present invention;

FIGS. 4(a) and 4(b) illustrate cross sectional and top views respectively of a clamp having a dielectric layer and a resilient layer according to another embodiment of the present invention;

FIGS. 5(a) and 5(b) illustrate cross sectional and top views respectively of a clamp having a dielectric layer having a plurality of protrusions and resilient layers according to a further embodiment of the present invention;

FIGS. 6(a) and 6(b) illustrate cross sectional and top views respectively of a clamp having a dielectric layer having a plurality of protrusions and resilient layers according to another embodiment of the present invention;

FIGS. 7(a) and 7(b) illustrate cross sectional and top views respectively of a clamp having a dielectric layer and a resilient layer having a plurality of gas channels according to another embodiment of the present invention;

FIGS. 8(a) and 8(b) illustrate cross sectional and top views respectively of a clamp having a dielectric layer including a plurality of protrusions according to another embodiment of the present invention;

DESCRIPTION OF THE INVENTION

Figure 9A:
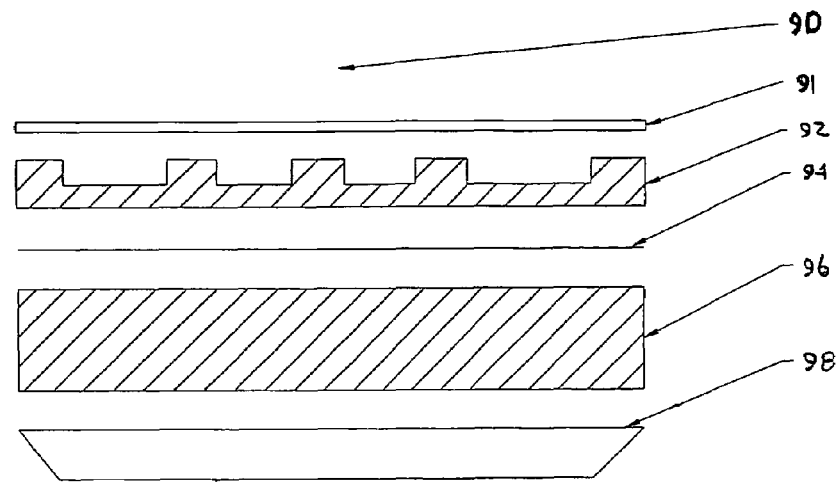
FIGS. 9(a) and 9(b) illustrate cross sectional and top views respectively of a work piece clamp with raised surface geometry according to another embodiment of the present invention.

According to the present invention, these objects and advantages are achieved in the apparatus for electrostatic clamping of workpieces as indicated in the following figures.

One embodiment of a clamp 10 is shown in FIGS. 1(a) and 1(b) wherein the dielectric layer 1 may be comprised of aluminum oxynitride and the insulator layer 3 may be comprised of alumina. The electrode 2 may be made of metal and a support base 4 of aluminum. Cooling gas is distributed via conventional cooling gas holes in the electrostatic clamp surface. A workpiece may be electrostatically or mechanically clamped to the clamping surface using known electrostatic or mechanical clamping techniques. An electrostatic clamp 10 of such a design has been fabricated and tested in an ion implanter. Test results indicate that the aluminum oxynitride can yield higher clamping force, lower gas leakage, lower particle levels and longer lifetime due to the material's durability, along with a declamping time compatible with high throughput ion implantation applications.

An additional embodiment includes an insulator layer 3 comprised of aluminum oxynitride or like material such as but not limited to alumina, sapphire, silicon carbide, aluminum nitride, diamond or material with properties similar to aluminum oxynitride.

Furthermore, another embodiment consists of a dielectric layer 1 of alumina, sapphire, silicon carbide, aluminum nitride, diamond or material with properties similar to aluminum oxynitride. Aluminum oxynitride provides optimal benefits in terms of both cost and functionality as compared to the other materials.

An additional embodiment includes both the insulator and dielectric comprised of aluminum oxynitride.

Another embodiment of a clamp 20 is shown in FIGS. 2(a) and 2(b) where the dielectric layer 11 is comprised of center section or resilient layer 5 of resilient material such as but not limited to silicone rubber surrounded by an annular or dielectric ring 11 comprised of aluminum oxynitride, alumina, sapphire, silicon carbide, aluminum nitride, diamond or any such a material with properties similar to aluminum oxynitride. The resilient layer 5 can have a filler material such as but not limited to silicon dioxide, silicon nitride, titanium dioxide, aluminum oxide, iron oxide or carbon black for enhancing heat transfer between semiconductor wafer and the electrostatic clamp 20. The annular ring 11 affords of an adequate width so as not to affect the testing for backside particles and provides an effective seal for cooling gas leakage into the process chamber of an ion implanter or such similar devices. The resilient material layer 5 centrally located affords a reduction in the generation of backside particle generation.

An alternate embodiment of a clamp 30 shown in FIGS. 3(a) and 3(b) comprises a dielectric layer 1 wherein there is a recessed cavity to capture a resilient layer 51 such as but not limited to silicone rubber surrounded by an annular or dielectric ring 12 comprised of alumina, sapphire, silicon carbide, aluminum nitride, diamond or any such a material with properties similar to aluminum oxynitride. The resilient layer 51 can have a filler material such as but not limited to silicon dioxide, silicon nitride, titanium dioxide, aluminum oxide, iron oxide or carbon black for enhancing heat transfer between semiconductor wafer and electrostatic clamp 30. The annular ring 12 affords an adequate width so as not to affect the testing for backside particles and provides an effective seal for cooling gas leakage into the process chamber of an ion implanter or such similar devices. The resilient material 51 centrally located provides means to reduce the generation of particles. The structure provides a high withstand voltage capability due the aluminum oxynitride dielectric.

A further embodiment of a clamp 40 shown in FIGS. 4(a) and 4(b), as compared to the embodiment shown in FIGS. 2(a) and 2(b), comprises a resilient layer 52 with a filler material such as but not limited to silicon dioxide, silicon nitride, titanium dioxide, aluminum oxide, iron oxide or carbon black to enhance heat transfer between semiconductor wafer and eclamp. This is attached to the dielectric layer 1 comprised of aluminum oxynitride, alumina, sapphire, silicon carbide, aluminum nitride, diamond or any such a material with properties similar to aluminum oxynitride. The resilient material layer 52 provides means to reduce the generation of particles. The dielectric layer 1 of aluminum oxynitride provides a high withstand voltage capability.

Shown in FIGS. 5(a) and 5(b) is an embodiment of a clamp 50 wherein the dielectric layer 15 is comprised of aluminum oxynitride, alumina, sapphire, silicon carbide, aluminum nitride, diamond or any such a material with properties similar to aluminum oxynitride and exhibits vertical protrusions 62 on top of which is a resilient layer 55 of resilient material such as but not limited to silicone rubber. The resilient layer 55 can have a filler material such as but not limited to silicon dioxide, silicon nitride, titanium dioxide, aluminum oxide, iron oxide or carbon black for enhancing heat transfer between semiconductor wafer and electrostatic clamp 50. The geometric dimensions and multiple placement of the protrusions 62 contribute to clamping force; distribution of cooling gas and heat transfer between the semiconductor wafer and the clamp 50; voltage withstand characteristics; particle generation and mechanical support of the work piece.

The embodiment of FIGS. 6(*a*) and 6(*b*) of a clamp 60 includes a dielectric layer 1 comprised of aluminum oxynitride, alumina, sapphire, silicon carbide, aluminum nitride, diamond or any such a material with properties similar to aluminum oxynitride and exhibits vertical protrusions 64 on top of which is a resilient layer 57 of resilient material such as but not limited to silicone rubber. The resilient layer 57 can have a filler material such as but not limited to silicon dioxide, silicon nitride, titanium dioxide, aluminum oxide, iron oxide or carbon black for enhancing heat transfer between semiconductor wafer and electrostatic clamp 64. The width, height, multiple placement and geometry of the protrusions 64 are dependent upon the requirements for clamping force; distribution of cooling gas, heat transfer between semiconductor wafer and eclamp; voltage withstand characteristics; particle generation; and mechanical support of the work piece. In addition, the annular ring 57 comprised of resilient material such as but not limited to silicone rubber wherein the resilient material may or may not be enhanced with additives, as described previously, for transfer of heat energy between semiconductor wafer and the clamp 60. The annular ring 57 is of adequate width depending upon the requirements for backside particles and effective sealing against leaking cooling gas.

Another embodiment of a clamp 70 is illustrated in FIGS. 7(*a*) and 7(*b*) employs a dielectric layer 18 whose material is comprised of aluminum oxynitride, alumina, sapphire, silicon carbide, aluminum nitride, diamond or any such a material with properties similar to aluminum oxynitride; and with an engineered cooling gas distribution system including a center gas supply 70 having gas channels 72 are not necessarily of consistent uniform cross-section, but may include, as required, transitional regions of non-uniform cross-section in order to facilitate the transfer of heat energy between semiconductor wafer and the clamp 70. The depth, width, location and number of the gas channels 72 are dependent upon the type of cooling gas and the requirements to adequately cool the wafer during the implant process.

The embodiment of a clamp 80 in FIGS. 8(*a*) and 8(*b*) includes a dielectric layer 19 comprised of aluminum oxynitride, alumina, sapphire, silicon carbide, aluminum nitride, diamond or any such a material with properties similar to aluminum oxynitride and exhibits vertical protrusions 66 of resilient material such as but not limited to silicone rubber in dielectric layer 19, although the protrusions could be on top of dielectric layer 19. The width, height, placement and geometry of the protrusions 66 are dependent upon the requirements for clamping force; distribution of cooling gas, heat transfer between semiconductor wafer and clamp 80; voltage withstand characteristics; particle generation; and mechanical support of the work piece.

Figure 9B:
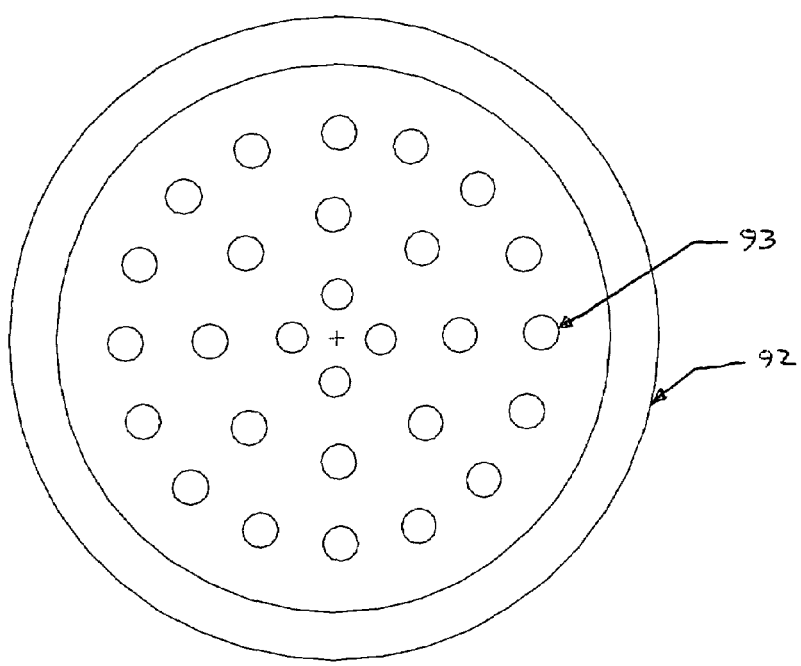

An embodiment of a clamp 90 shown in FIGS. 9(*a*) and 9(*b*) includes a dielectric layer 92 and an insulator layer 96 which may be comprised of alumina. The dielectric layer 92 may contain a raised surface geometry or embossments 93 for improving cooling gas pressure uniformity. An electrode 94 may be made of metal and a support base 98 may be made of aluminum. Cooling gas may be distributed via conventional cooling gas holes in the surface of the clamp 90. A workpiece 91 may be electrostatically or mechanically clamped to the clamping surface using known electrostatic or mechanical clamping techniques. Test results for electrostatic clamps according to the present embodiment indicate that the embossments 93 provide lower gas leakage, lower particle levels, improved heat transfer and longer lifetime of the clamp due to lower contact area with the workpiece, uniform cooling gas layer and durability of the material for ion implantation applications. The dielectric layer 92 may comprise alumina or like materials such as but not limited to sapphire, silicon carbide, aluminum nitride, diamond or materials with similar properties. Similarly, the insulator layer 96 may comprise alumina or like materials such as but not limited to sapphire, silicon carbide, aluminum nitride, diamond or materials with similar properties.

Figure 10A:
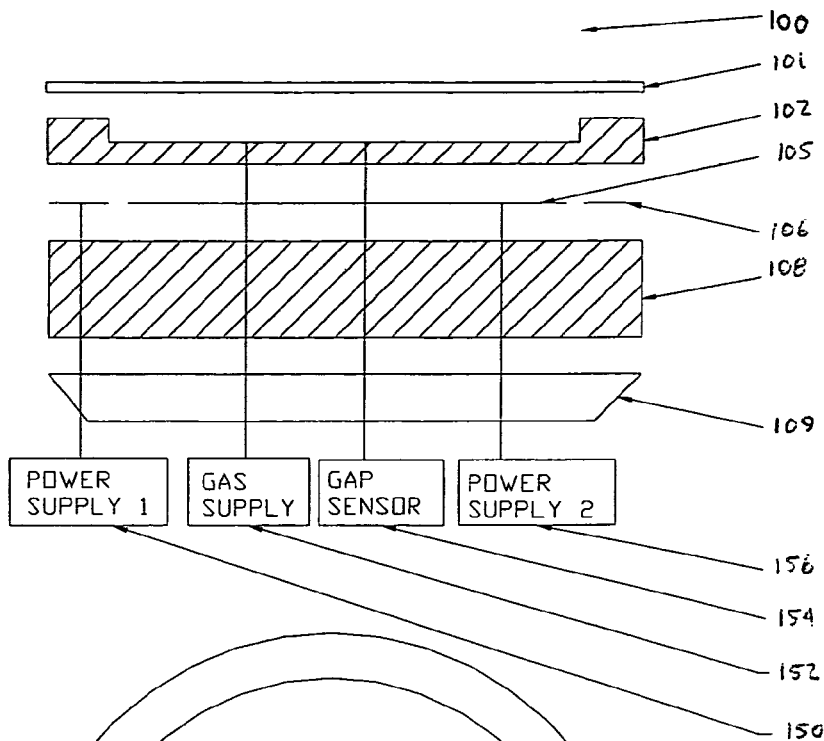
FIGS. 10(a) and 10(b) illustrate cross sectional and top views respectively of a clamp having a two-part electrode according to another embodiment of the present invention.
Figure 10B:
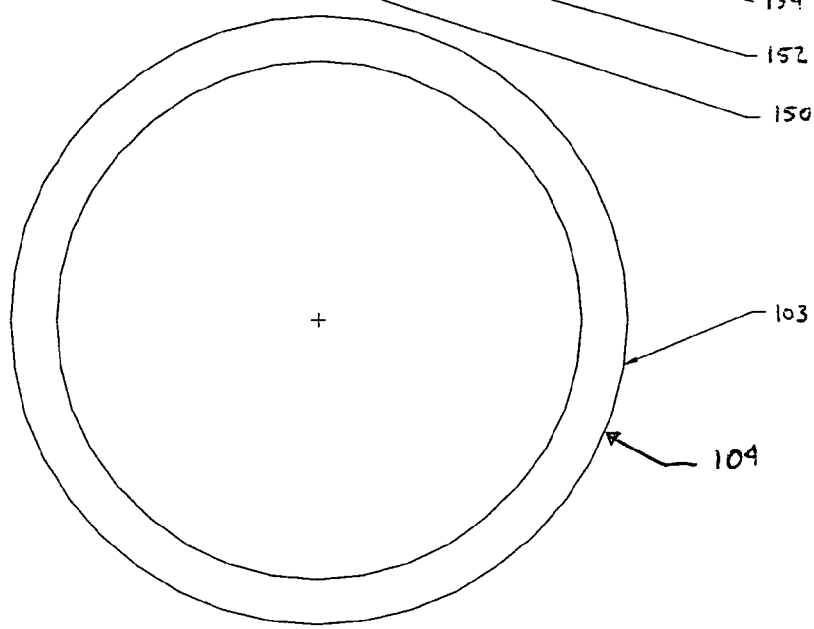
Figure 10C:
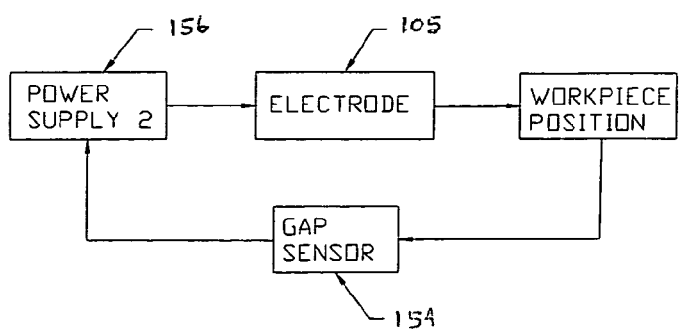
FIG. 10(c) illustrates a feedback circuit for the workpiece and the clamp for the embodiment shown in FIGS. 10(a) and 10(b)

Another embodiment of a clamp 100 is shown in FIGS. 10(*a*) and 10(*b*) where a dielectric layer 102 comprises an outer ring 103 and a center cavity 104. A workpiece 101 may be placed on the clamp 100 so that only the outer ring 103 is contacted. A center electrode 105 is configured with an outer ring electrode 106 connected to a first power supply 150 and the center electrode 105 connected to a second power supply 156. Cooling gas is provided to the clamp 100 by a gas supply 152. The position of the workpiece 101 is detected by a gap sensor 154 which is connected in a feedback circuit with the center electrode 105 and the second power supply 156 as shown in FIG. 10(*c*). The attractive force on the workpiece 101 provided by the center electrode 105 is adjusted proportional to the workpiece gap by adjusting the second power supply 156 to balance the repulsive force provided by the cooling gas from the gas supply 152. In the present embodiment, no contact is provided between the workpiece 101 and the dielectric layer 102 within the center cavity 104. Therefore, a reduction in particle contamination on the basckside of the workopiece 101 is realized.

Figure 11A:
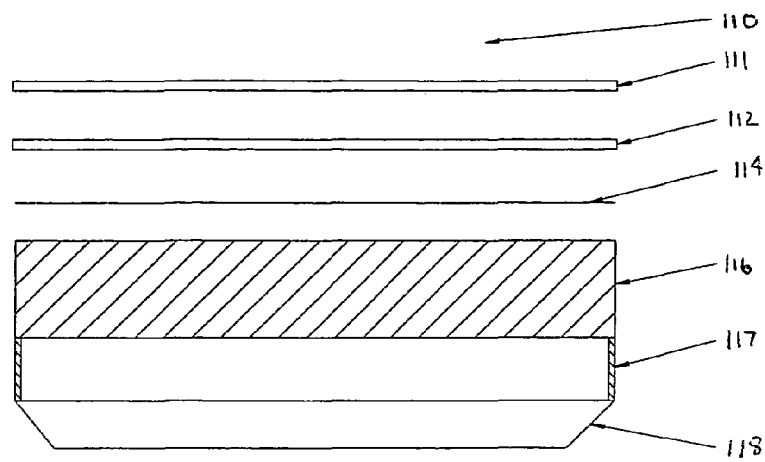
FIGS. 11(a) and 11(b) illustrate cross sectional and top views respectively of a clamp having a sleeve component according to another embodiment of the present invention.
Figure 11B:
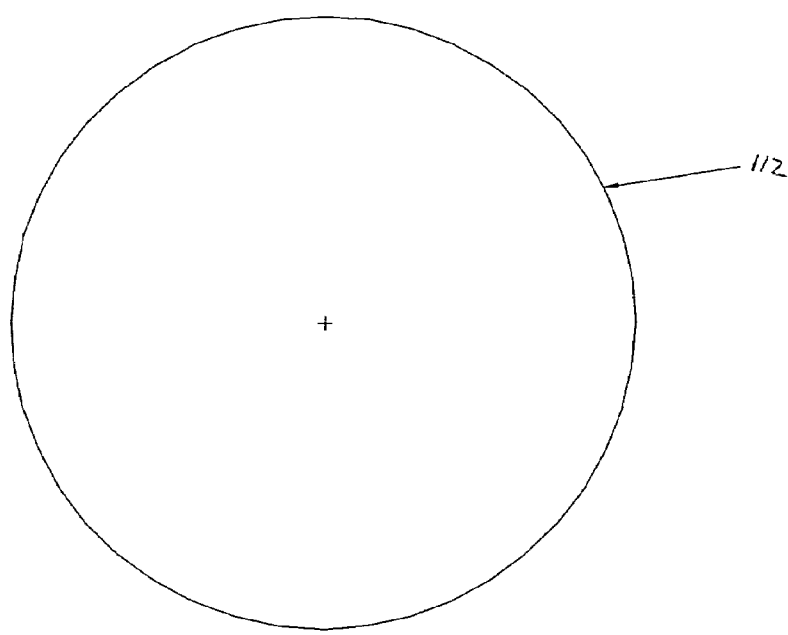

Another embodiment of a clamp 110 is shown in FIGS. 11(*a*) and 11(*b*) where an insulator 116 is connected to a base 118 with a thin wall sleeve 117. A workpiece 111 may be placed on a dielectric layer 112 of the clamp 110 with an electrode 114 positioned between the dielectric layer 112 and the insulator 116. In the present embodiment, the thermal expansion of the insulator 116, the dielectric layer 112 and the base 118 occur at different rates due to their individual properties without causing bowing of their surfaces, which may be called a "bimetallic: effect, because the sleeve 117 distorts radially. The bowing of the dielectric 112 causes non-uniform ion implantation especially at non-perpendicular implant angles and the clamp 110 of the present embodiment reduces bowing of the dielectric 112 and improves the implantation uniformity.

Figure 12:
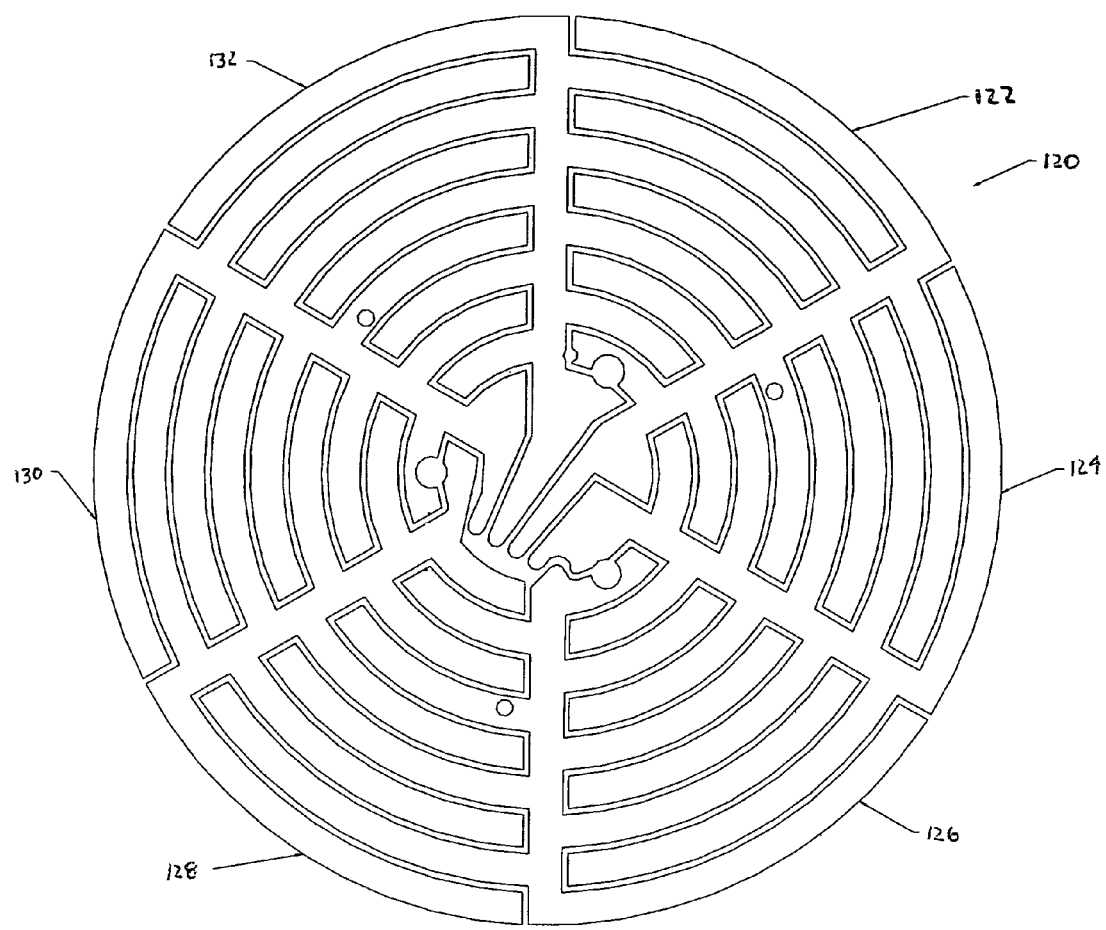
FIG. 12 illustrates a clamp having an interlocking electrode according to another embodiment of the present invention.

Another embodiment of a clamp 120 is shown in FIG. 12 where the electrode sections 122, 124, 126, 128, 130 and 132 are interdigitated. The opposite electrode sections for each electrode pair 122 and 128, 124 and 130, and 126 and 132 are electrically charged with alternating current (time shifted, opposite polarity) so that the workpieces disposed on the clamp 120 may be attracted to a dielectric of the clamp 120. The alternating current allows rapid release of the workpiece when the electricity is shut off which is desirable for high throughput ion implanters. The narrow, interdigitated electrode sections 122-132 limit the span of the workpiece which loses its attractive force when the alternating current electricity changes polarity on adjacent electrode sections. The small span of electrode sections 122-132 limits the workpiece deflection caused by the cooling gas pressure. This limits the relative motion between the workpiece and the surface of the dielectric so that the generation of particulate contamination of the workpiece is minimized Many modifications and variations may become apparent in light of the above teachings. Many additional changes in the details, materials, and arrangement of parts, herein described and illustrated, can be made by those skilled in the art. Accordingly, it will be understood that the present invention is not to be limited to the embodiments disclosed herein, can include practices otherwise than specifically described, and are to be interpreted as broadly as allowed under the law.

What is claimed is:

1. An apparatus for clamping a semiconductor workpiece, comprising:
   a support base;
   an insulator layer disposed on the support base;
   an electrode layer disposed on the insulator layer;
   a clamping layer disposed on the electrode layer comprising a dielectric layer and a resilient material layer, the dielectric layer defining an outer annular ring and a recessed cavity within the outer annular ring wherein the dielectric layer defines a plurality of protrusions extending from a bottom surface of the recessed cavity and the resilient material layer being formed on predetermined ones of the protrusions to extend from the bottom surface of the recessed cavity to a predetermined height, and wherein the workpiece is clamped to the surface of the clamping layer.
2. An apparatus according to claim 1, wherein the workpiece is electrostatically clamped to the clamping layer.
3. An apparatus according to claim 1, wherein the workpiece is mechanically clamped to the clamping layer.
4. An apparatus according to claim 1, wherein the support base comprises aluminum.
5. An apparatus according to claim 1, wherein the insulator layer comprises alumina, sapphire, silicon carbide, aluminum nitride, or diamond.
6. An apparatus according to claim 1, wherein the electrode layer comprises metal.
7. An apparatus according to claim 1, wherein the workpieee comprises a semiconductor wafer.
8. An apparatus according to claim 1, wherein the dielectric layer comprises alumina, sapphire, silicon carbide, aluminum nitride, or diamond.
9. An apparatus according to claim 1, wherein the resilient material layer comprises silicone rubber and a filler material of silicon dioxide, silicon nitride, titanium dioxide, aluminum oxide , iron oxide or carbon black.
10. An apparatus according to claim 1, wherein the clamping layer comprises the dielectric layer and the resilient material layer disposed on the surface of the dielectric layer.
11. An apparatus according to claim 1, wherein the resilient material layer is formed on each of the protrusions.
12. An apparatus according to claim 1, wherein the resilient material layer is formed on the protrusions of the clamping layer excluding the outer annular ring thereof wherein the dielectric material on the outer annular ring extends to approximately the same height as the height of the resilient material layer on the protrusions.
13. An apparatus according to claim 1, wherein the dielectric layer comprises a plurality of embossments.
14. An apparatus according to claim 1, wherein the dielectric layer comprises the outer annular ring for contacting the workpiece and the center recessed cavity within the outer annular ring.
15. An apparatus according to claim 1, further comprising a thin wall sleeve between the support base and the dielectric layer.
16. An apparatus according to claim 1, wherein the electrode layer comprises a plurality of interdigitated electrode pairs.
17. An apparatus according to claim 16, further comprising an alternating current source connected to the interdigitated electrodes pairs such that opposite ones of the electrode pairs are supplied with alternating current.

\* \* \* \* \*

UNITED STATES PATENT AND TRADEMARK OFFICE
CERTIFICATE OF CORRECTION

PATENT NO. : 7,595,972 B2  Page 1 of 1
APPLICATION NO. : 11/263113
DATED : September 29, 2009
INVENTOR(S) : Muka et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 378 days.

Signed and Sealed this

Twenty-eighth Day of September, 2010

David J. Kappos
*Director of the United States Patent and Trademark Office*